(12) United States Patent
Boettiger et al.

(10) Patent No.: US 7,701,636 B2
(45) Date of Patent: Apr. 20, 2010

(54) GRADIENT INDEX MICROLENSES AND METHOD OF FORMATION

(75) Inventors: Ulrich Boettiger, Boise, ID (US); Saijin Liu, Boise, ID (US)

(73) Assignee: Aptina Imaging Corporation, George Town, Grand Cayman (KY)

( * ) Notice: Subject to any disclaimer, the term of this patent is extended or adjusted under 35 U.S.C. 154(b) by 69 days.

(21) Appl. No.: 12/043,838

(22) Filed: Mar. 6, 2008

(65) Prior Publication Data

US 2009/0225435 A1    Sep. 10, 2009

(51) Int. Cl.
*G02B 27/10* (2006.01)
*G02B 3/00* (2006.01)

(52) U.S. Cl. .............................. 359/620; 359/652

(58) Field of Classification Search ......... 359/652–654, 359/619, 620
See application file for complete search history.

(56) References Cited

U.S. PATENT DOCUMENTS

| | | | |
|---|---|---|---|
| 5,442,482 A | 8/1995 | Johnson et al. | |
| 5,926,319 A | 7/1999 | Phillips et al. | |
| 6,661,581 B1 | 12/2003 | Sankur | |
| 7,009,772 B2 | 3/2006 | Hsiao et al. | |
| 2001/0048968 A1* | 12/2001 | Cox et al. | 427/162 |
| 2004/0036069 A1 | 2/2004 | Barton et al. | |
| 2004/0211884 A1 | 10/2004 | Fang et al. | |
| 2005/0036738 A1 | 2/2005 | Zhou et al. | |
| 2005/0133478 A1 | 6/2005 | Kim et al. | |
| 2005/0146795 A1 | 7/2005 | Gretton et al. | |
| 2005/0242056 A1 | 11/2005 | Ho et al. | |
| 2006/0046204 A1 | 3/2006 | Ono et al. | |
| 2007/0033176 A1 | 2/2007 | Enns | |
| 2007/0035844 A1 | 2/2007 | Li et al. | |
| 2007/0096010 A1 | 5/2007 | Pallaro et al. | |
| 2007/0187793 A1 | 8/2007 | Moon et al. | |
| 2007/0217020 A1 | 9/2007 | Li et al. | |
| 2007/0252074 A1 | 11/2007 | Ng et al. | |
| 2007/0273054 A1 | 11/2007 | Hernandez | |

FOREIGN PATENT DOCUMENTS

| | | |
|---|---|---|
| JP | 2000031445 | 1/2000 |
| JP | 2004-296590 | 10/2004 |
| JP | 2005326641 | 11/2005 |
| WO | WO-02-27360 | 4/2002 |

OTHER PUBLICATIONS

M. Leonard Riaziat, "Practical LEOS Applications", Circuits and Devices, Sep. 1993.

(Continued)

*Primary Examiner*—William C Choi
(74) *Attorney, Agent, or Firm*—Dickstein Shapiro LLP

(57) ABSTRACT

A lens includes a gradient index of refraction and a curved shape. A method of making the lens includes forming a plurality of layers, forming a shaped resist on the plurality of layers, and etching the resist and the plurality of layers to transfer the shape of the resist into the plurality of layers.

25 Claims, 17 Drawing Sheets

OTHER PUBLICATIONS

Sakakibara, et al., "A-1 Format 1.5M Pixel IT-CCD Image Sensor for an HDTV Camera System", IEEE Transactions on Consumer Electronics, vol. 37, No. 3, Aug. 1991, pp. 487-493.

Kimiaki Toshikiyo et al., A MOS Image Sensor with Microlenses Built by Sub-Wavelength Patterning, IEEE International Solid State Circuits Conference, 2007.

T. H. Hsu, et al., "A High Efficiency CMOS Image Sensor with Air Gap in situ Microlens (AGML) Fabricated by 0.18-μm CMOS Technology", IEEE Electron Device Letters, vol. 26, No. 9, Sep. 2005.

Andrew R. Parker, "A Vision For Natural Photonics", PHil Trans. Royal Society, vol. 362, No. 1825, pp. 2709-2720, Dec. 15, 2004.

* cited by examiner

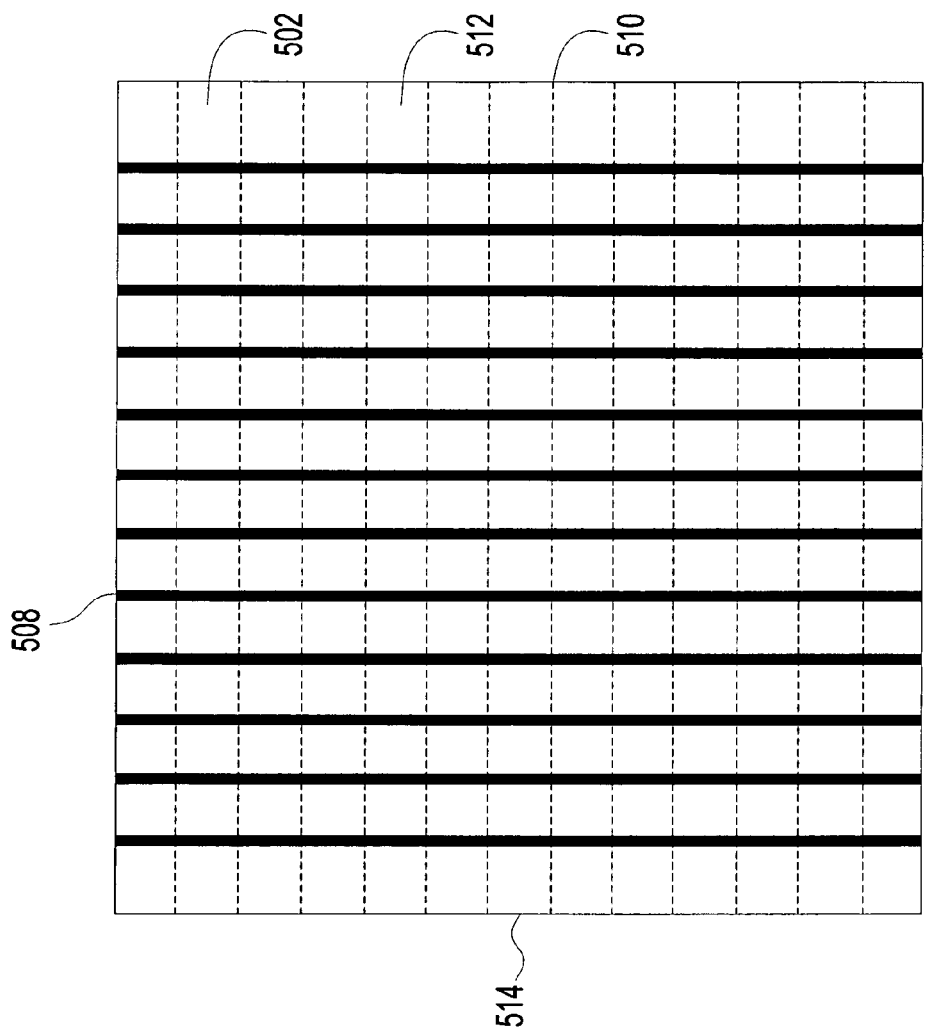
FIG. 5B
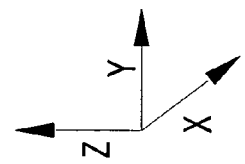

GRADIENT INDEX MICROLENSES AND METHOD OF FORMATION

FIELD OF THE INVENTION

Embodiments of the invention relate to a lens for focusing light and more specifically to a microlens for solid state image applications.

BACKGROUND OF THE INVENTION

Solid state imagers, including charge coupled devices (CCD) and CMOS imagers, are used in photo imaging applications. A solid state imager includes a focal plane array of pixels, typically arranged in rows and columns, each one of the pixels including a photosensor for accumulating photo-generated charge. A microlens is placed over a respective imager pixel and is used to focus light onto the respective photosensor. The use of microlenses significantly improves the photosensitivity of the imager by collecting light from a large light collecting area and focusing it on a small photosensitive area of the pixels. The ratio of the overall light collecting area of the photosensitive area to the overall area of the pixel is known as the "fill factor" of the pixel.

Optimally, all of the light from a pixel's overall light collecting area, including an associated microlens, will be directed to the pixel's photosensitive area. However, in practice, a phenomenon known as optical crosstalk can result when off-axis light strikes a microlens at an obtuse angle and strikes the photosensitive region of an adjacent pixel. Optical crosstalk can degrade the quality of a captured image by causing a light reading that is too low in some pixels and too high in others, and can alter color balance of an image, as light intended for one color pixel strikes the photosensitive area of a different color pixel.

Accordingly, it is desirable to have a microlens that could reduce optical crosstalk.

BRIEF DESCRIPTION OF THE DRAWINGS

FIG. 5B is a top view of a step of manufacturing lenses according to an embodiment described herein.

DETAILED DESCRIPTION OF THE INVENTION

Figure 1:
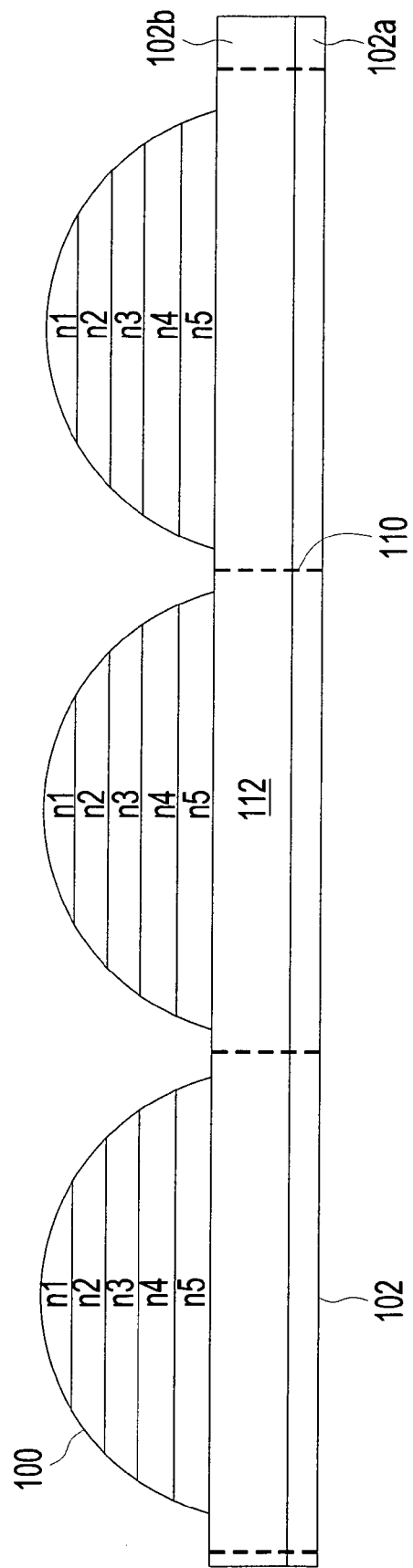
FIG. 1 is a side view of microlenses according to an embodiment described herein.

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice them, and it is to be understood that other embodiments may be utilized, and that structural, logical and electrical changes may be made.

As described below in more detail below, embodiments discussed herein relate to microlenses having a curved profile, for example, a parabolic or spherical profile, and a gradient index of refraction due to an arrangement of layers of lens material having different values of index of refraction. Embodiments discussed herein also relate to methods of making such microlenses. Gradient index microlenses may provide better optical performance than conventional microlenses and may be easily designed to provide flexibility for different applications. For example, gradient index microlenses may be fabricated with variations in microlens gradient structure at different spatial locations of the pixel array as needed to meet chief ray angle (CRA) and pixel symmetry requirements.

Referring now to the drawings, FIG. 1 illustrates a side view of microlenses 100 having a gradient index of refraction and formed over a substrate 102. A pixel array including a plurality of pixels 112, denoted by dashed lines 110, may be formed in a semiconductor layer 102a of substrate 102, which also has a plurality of fabrication layers, including an upper color filter array layer, collectively denoted as 102b and provided over the semiconductor layer 102a. The microlenses 100 may be arranged such that one microlens 100 is arranged over each pixel 112 of the pixel array.

Each microlens 100 includes a plurality of lens material layers, for example, the material layers denoted as n1, n2, n3, n4, n5. Each layer n is made up of a transparent lens material having an index of refraction that is different from the layers adjacent to it. Although the microlens 100 shown in FIG. 1 includes five layers n1, n2, n3, n4, n5 of lens material, it should be understood that each microlens 100 may have more than five or as few as two layers n of lens material. A greater number of layers n can help provide a smoother index of refraction transition throughout the microlens 100. In one embodiment, the layers n may be deposited using a suitable deposition technique and deposition tools to allow a smooth continuous variation of film properties (e.g. refractive index n) between layers n by adjustment of deposition recipes (e.g. in a CVD process: gas mix, pressure, RF power, etc.).

Each layer n has an index of refraction that is different from the index of refraction of adjacent layers. In one embodiment, the index of refraction of each layer n may be progressively smaller from the top layer n1 to the bottom layer n5 to form an index of refraction of n1>n2>n3>n4>n5. In another embodiment, the index of refraction may be progressively larger from the top layer n1 to the bottom layer n5 to form an index of refraction of n1<n2<n3<n4<n5. In other embodiments, the relationship of the index of refraction between layers n may be tailored for a specific application such that each layer n may have an index of refraction that is either higher or lower than the index of refraction of the layer n adjacent and may have an index of refraction that is equal to layers n not adjacent. Each microlens 100 also has different refractive indexes from the center to the edge of the microlens, due to fewer lens material layers being provided near the edges of each microlens 100, compared to the centers of each microlens 100.

The layers n may be formed of transparent lens material. Materials that may be used include silicon oxides SiOx, silicon carbide SiC, silicon nitride $S_3N_4$, titanium dioxide $TiO_2$, indium tin oxide ITO, aluminum oxide $Al_2O_3$, and other transparent lens materials. Each layer n may be made of a different material or a different combination of the same materials than adjacent layers. For example, the layers n may include one or more layers including mixtures of $SiO_2$ and $S_3N_4$ in different proportions for different layers. The thickness of each of the layers n may be varied to optimize the focus characteristics required for a given microlens application. Characteristics of the films, such as refractive index, may be continuously variable and the continuously variable films may be part of the stack of the layers n or may make up the entire stack of layers n.

Figure 2:
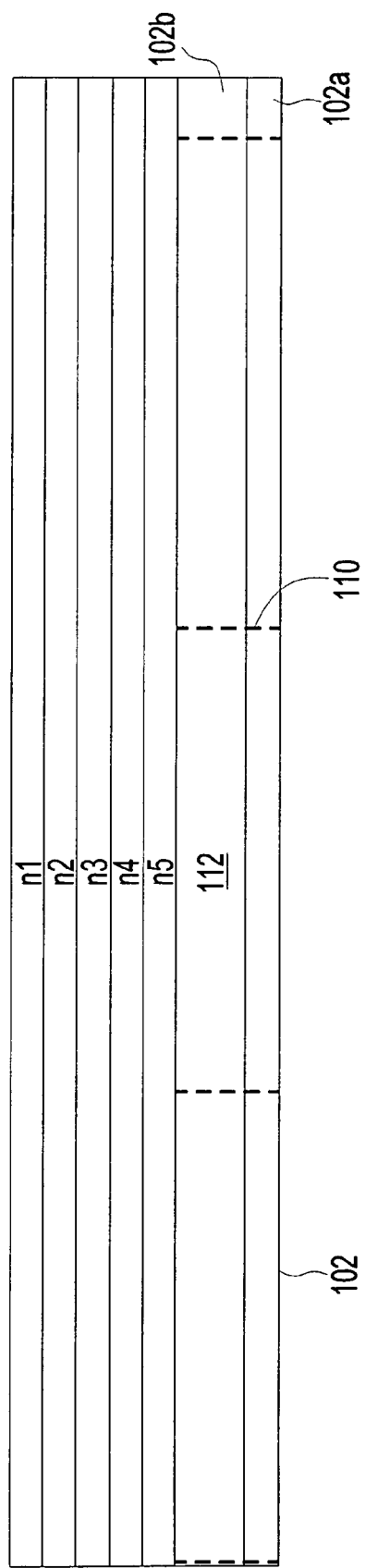
FIG. 2 is a side view of a step of manufacturing lenses according to an embodiment described herein.
Figure 3:
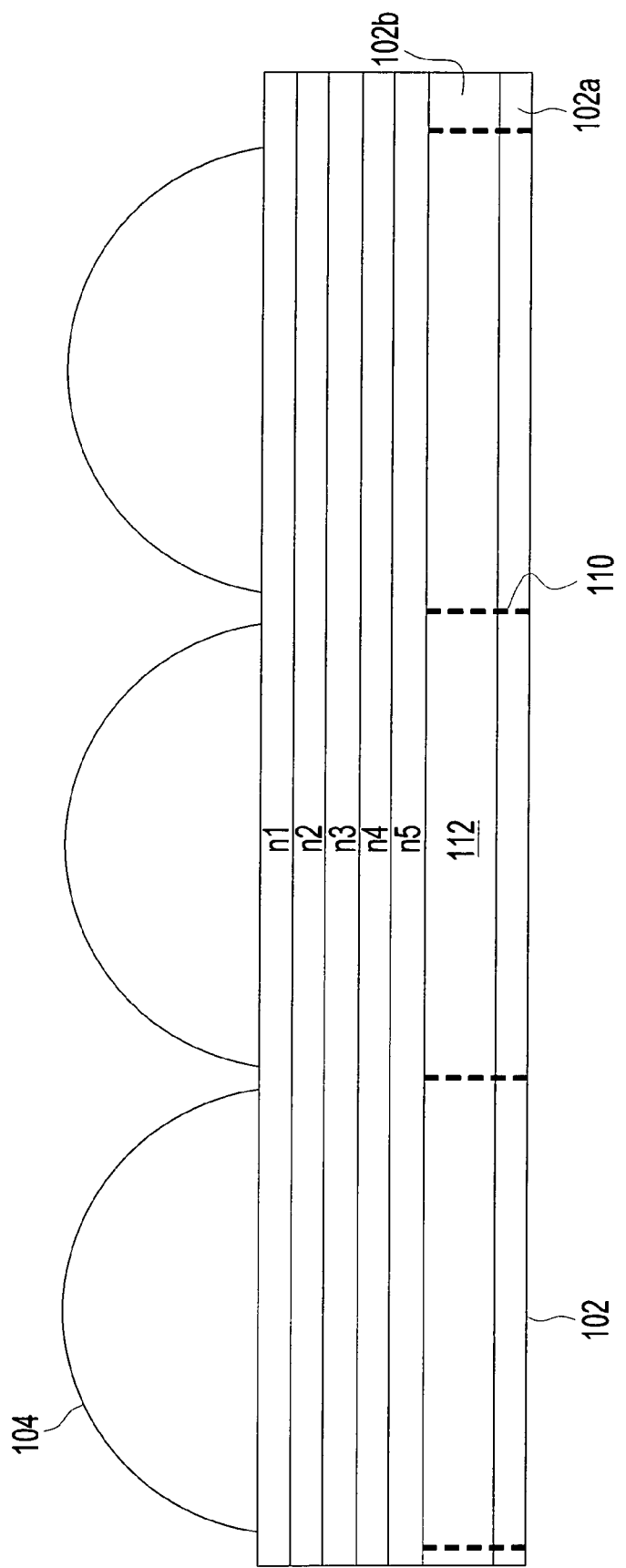
FIG. 3 is a side view of a step of manufacturing lenses according to an embodiment described herein.
Figure 4:
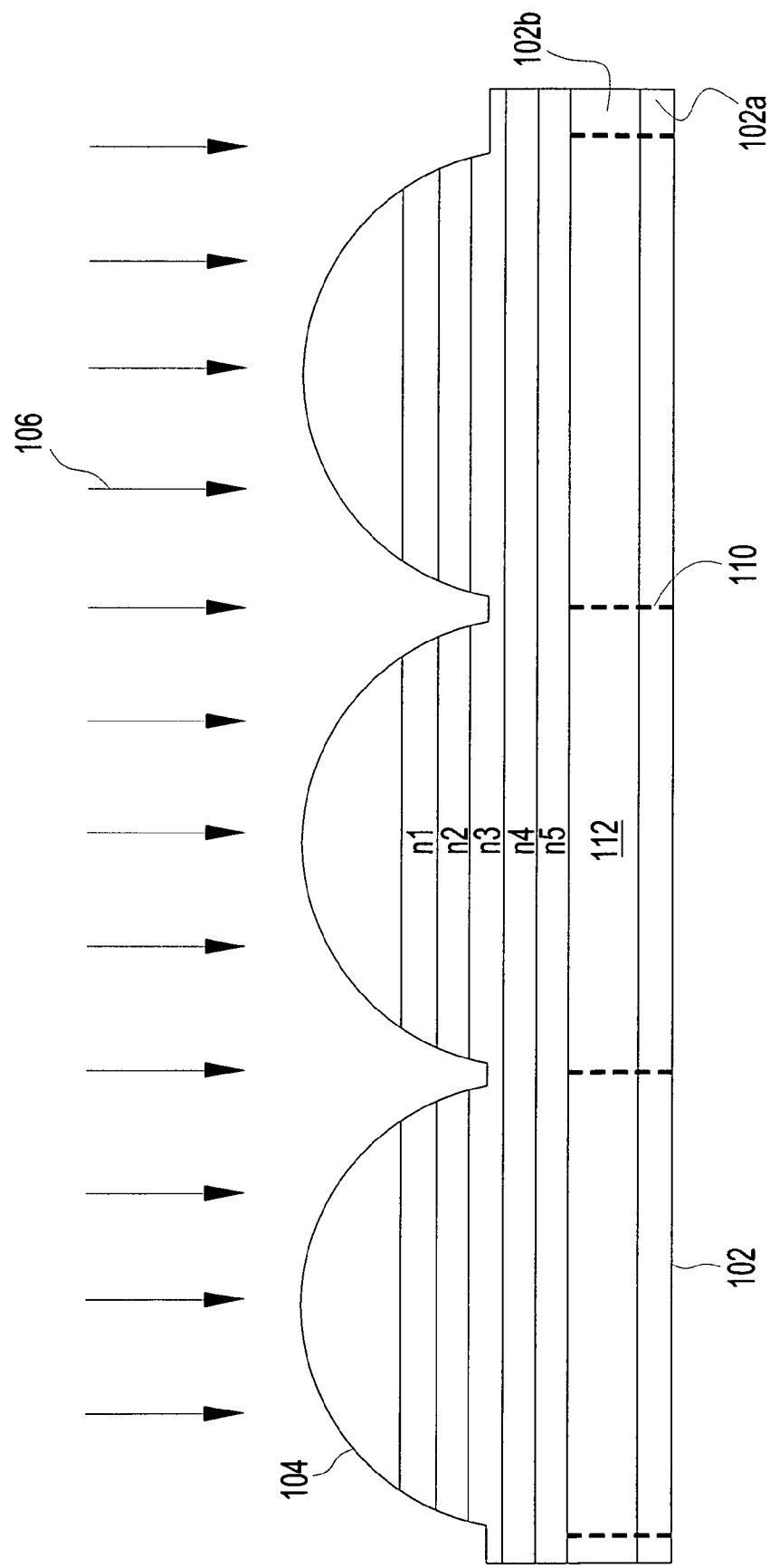
FIG. 4 is a side view of a step of manufacturing lenses according to an embodiment described herein.

Referring to FIGS. 2-4, a method of forming the gradient index of refraction microlenses 100 is described. Referring first to FIG. 2, a plurality of layers n1, n2, n3, n4, n5, each having an index of refraction different from adjacent layers n, are formed on a substrate 102. The plurality of layers n may be deposited by various known methods, such as atomic layer deposition (ALD), physical vapor deposition (PVD), chemical vapor deposition (CVD), spin-on deposition, ink jet deposition, or the like. As discussed above, each of the layers n1, n2, n3, n4, n5 may be formed to a different thickness or the same thickness according to the desired properties of the finished microlenses 100. Further, each layer n may be made of a different material, or a different combination of the same materials, compared with adjacent layers.

As shown in FIG. 3, a plurality of resist areas 104 are formed over the layers n on the substrate 102 by a known process. The resist areas 104 have the shape of the corresponding gradient index microlenses 100 to be formed and are arranged above the location where the corresponding gradient index microlenses 100 will be formed. In one embodiment, the resist areas 104 may be parabolic to produce parabolic microlenses 100. The location of the resist areas 104, and therefore the location of the finished microlenses 100 may be shifted relative to the pixels 112 of the array. The shift may be variable across the array and may depend on the refractive index profile of the stack.

In one embodiment, the resist areas 104 may be formed in an array by depositing a layer of resist material above the plurality of layers n, patterning the layer of resist material by exposure and developing, and forming the curved profile of the resist areas 104 by a re-flow process. In other embodiments, other known methods of forming shaped microlenses may be used, such as gapless processes and molding.

The resist areas 104 are etch transfer areas used to form the gradient index microlenses 100. Therefore, the resist area material need not be transparent, but may instead be selected for etch rate considerations. Furthermore, the resist areas 104 need not have a gradient index of refraction themselves and therefore may be formed of a single material.

The shape of the resist areas 104 is transferred into the plurality of layers n1, n2, n3, n4, n5 to form the gradient index microlenses 100 by etching. FIG. 4 shows partially etched resist areas 104 during the etching process. The transfer method can be any anisotropic etching, such as dry etching. As the resist areas 104 are etched away by the etchant 106, the plurality of layers n1, n2, n3, n4, n5 will also be etched at the same or similar rate to cause the layers n to assume the shape of the resist areas 104. The etch process can be tailored to achieve the required etch profile of the completed lenses, depending on the layer n that is being etched at any given time. The shape of the etched lens 100 will depend on the selectivity of the etch chosen to transfer the lens into the plurality of layers n. If a non-selective etch is chosen, the shape of the resist area 104 will transfer exactly or substantially exactly. If the etch selectivity between the layers n and the resist areas 104 are different, a corresponding change in surface curvature will result, depending on the etch rate ratio between the layers n and the resist areas 104. If a time dependent selectivity change is chosen, certain shape variations can be dialed in, as afforded by the available selectivity range of the materials and tool parameters.

In one embodiment, the resist areas 104 are totally etched away at the end of the etching process to provide microlenses 100 as shown in FIG. 1. In another embodiment, some portion of the resist areas 104 may be left with its corresponding optical contribution to the microlens 100, for example, if the etching process were stopped at the point shown in FIG. 4. If the material used in the resist areas 104 is opaque, it can form a stop or curved mirror.

Figure 5A:
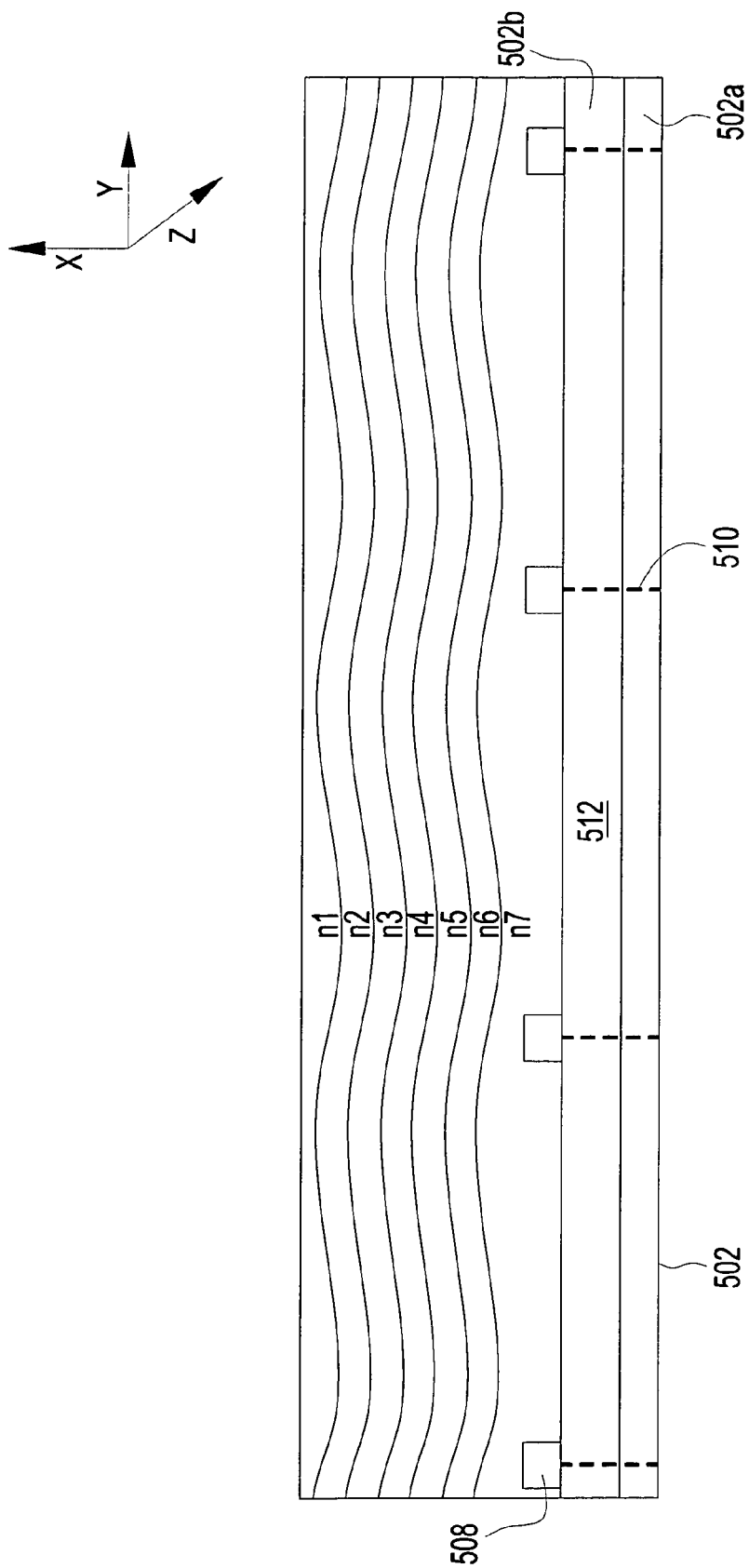
FIG. 5A is a side view of a step of manufacturing lenses according to an embodiment described herein.

FIG. 5A shows a step in a process of forming microlenses 500 (FIG. 7) having asymmetric gradient index of refraction profiles. A pixel array including a plurality of pixels 512, denoted by dashed lines 510, may be formed in a semiconductor layer 502a of substrate 502, which also has a plurality of fabrication layers, including an upper color filter array layer, collectively denoted as 502b and provided over the semiconductor layer 502a.

An uneven surface is formed on a substrate 502 by arranging a series of material bumps 508 on the surface of the substrate. In one embodiment, the bumps 508 may be arranged by applying a layer of material on the surface of the substrate 502 and forming the layer into bumps 508 using a mask and etching step. The bumps 508 may be transparent or opaque material, and if transparent, may be formed of materials such as silicon oxides SiOx, silicon carbide SiC, silicon nitride $S_3N_4$, titanium dioxide $TiO_2$, indium tin oxide ITO, aluminum oxide $Al_2O_3$, and other transparent materials.

Figure 5C:
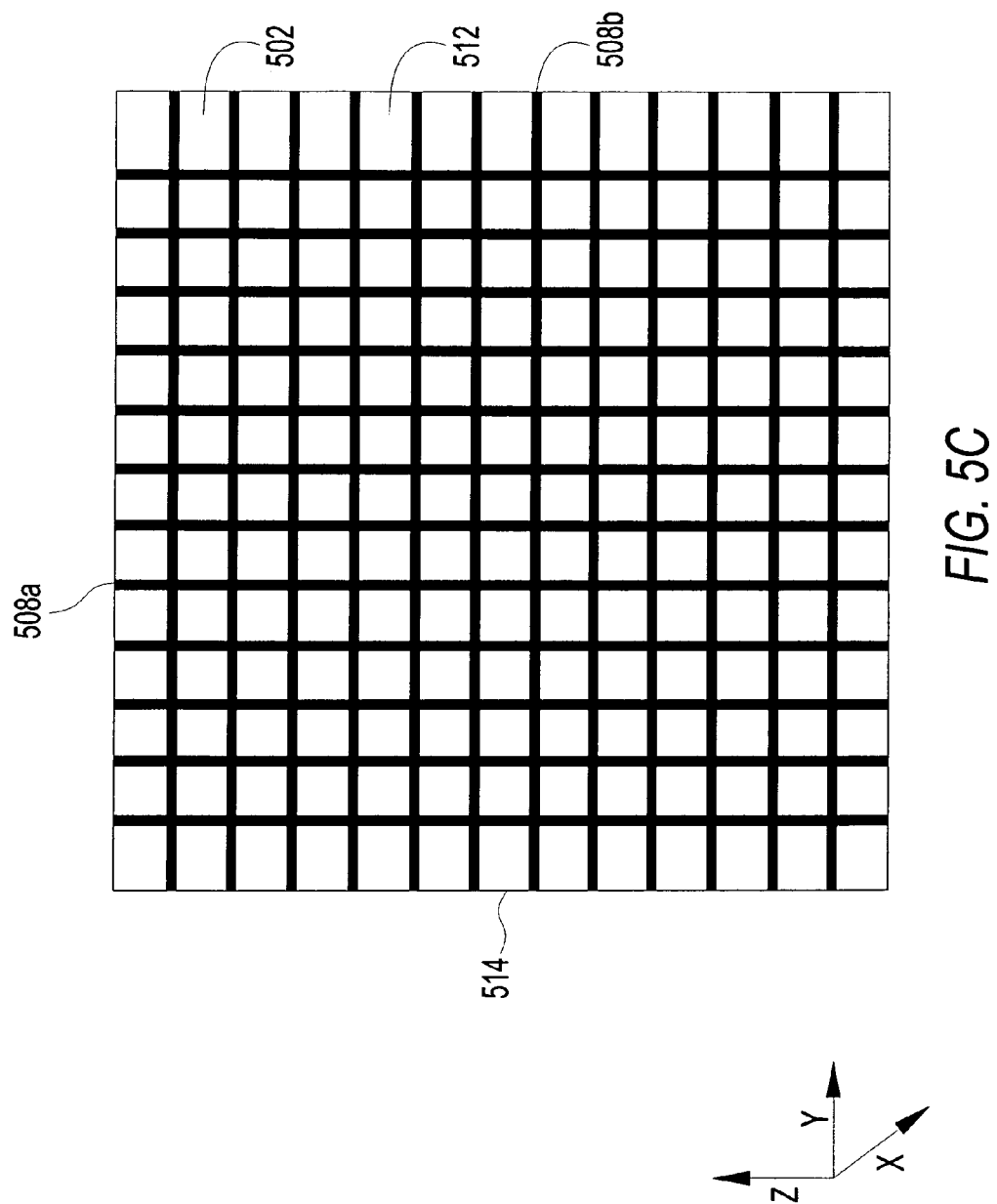
FIG. 5C is a top view of a step of manufacturing lenses according to an embodiment described herein.

The bumps 508 may be of varying shapes and lengths, i.e., the z direction of FIG. 5A. FIG. 5B shows a top view of the substrate 502 and bumps 508 of FIG. 5A. In FIG. 5B, it can be seen that the bumps 508 extend the length of the pixel array 514 at the edges of the pixels 502. FIG. 5C shows another embodiment in which two sets of bumps 508a, 508b are arranged perpendicular to each other. In other embodiments, the bumps may be arranged in other configurations depending on the desired gradient profile of the lenses 500.

A plurality of layers n1, n2, n3, n4, n5, n6, n7 are formed sequentially over the substrate 502 and the bumps 508 by a method described above with regard to FIG. 2. As can be seen from FIG. 5A, the bumps 508 will cause each layer to adopt a periodic topography variation conforming to the layer below to some degree. How closely each layer n conforms to the shape of the layer n below it will affect the over all arrangement of the layers n and may be adjusted to achieve results desired for a particular microlens application. The top layer n1 may be planarized using known methods, such as chemical mechanical polishing (CMP) or grinding.

Figure 6:
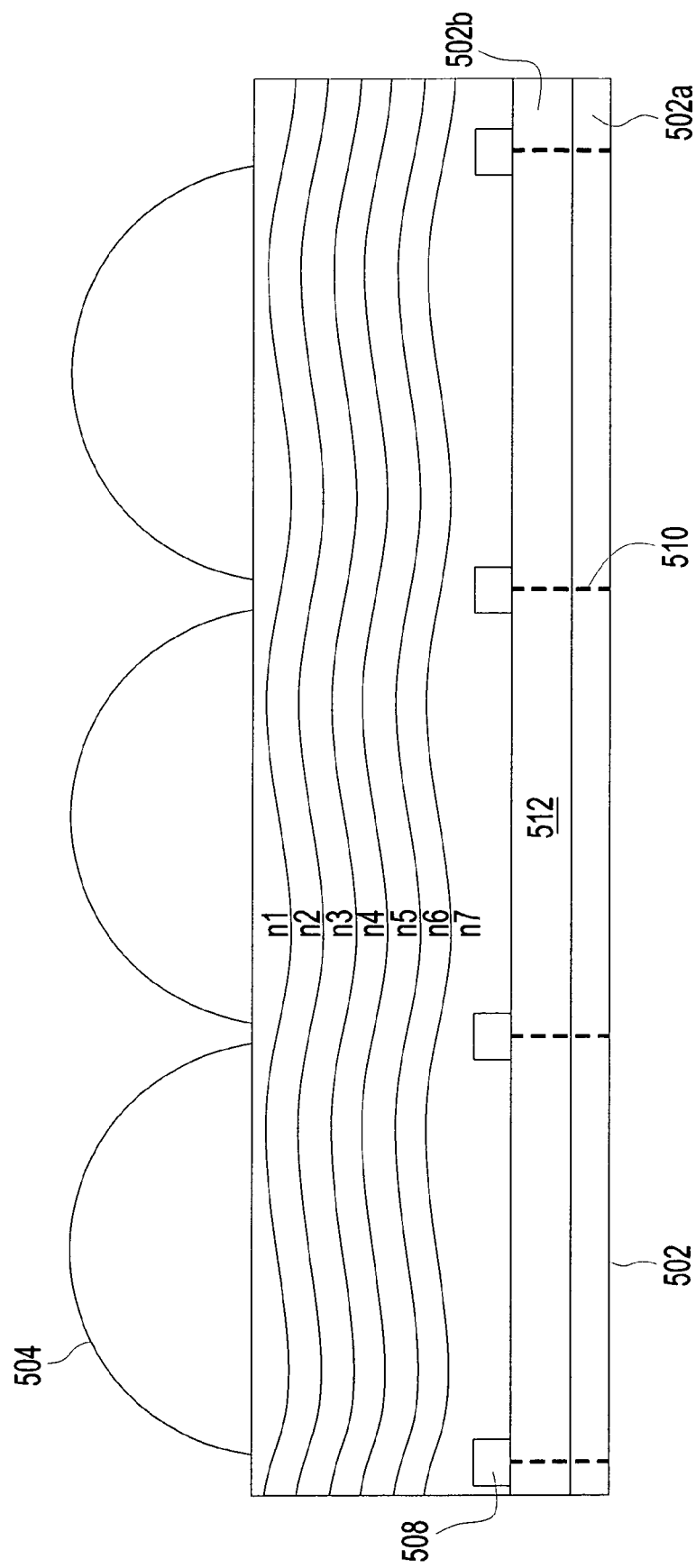
FIG. 6 is a side view of a step of manufacturing lenses according to an embodiment described herein.

As shown in FIG. 6, resist areas 504 are formed on the top layer n1 by a method described above with regard to FIG. 3. The resist areas 504 may be located in positions that are shifted across the pixel array relative to the underlying topography to further modify the focus/light bending characteristics of the final microlenses 500. The shape of the resist areas 504 is transferred into the layers n using anisotropic etching as described above with regard to FIG. 4 to form the microlenses 500 shown in FIG. 7. The microlenses 500 have asymmetric index of refraction profiles, that is, the amount that light is refracted is not the same at each point at a given radius from a center y axis of the lens, as opposed to the symmetric lenses 100 shown in FIG. 1, in which the amount that light is refracted is the same at any given radius from a center y axis. The microlenses 500 may be used to reduce cross-talk from angled light.

Figure 7:
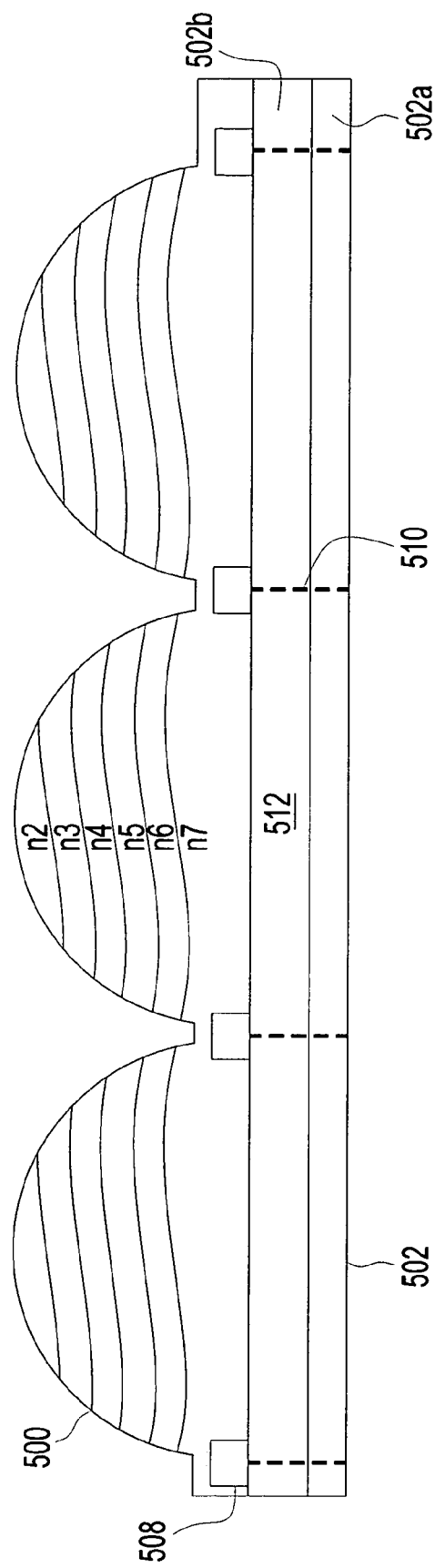
FIG. 7 is a side view of a step of manufacturing lenses according to an embodiment described herein.

Each of the microlenses 500 shown in FIG. 7 has an identical asymmetric index of refraction profile because the material bumps 508 are laid out in a pattern that is the same for each pixel 512, i.e., one bump is arranged at an edge of each pixel 512. The topography variation of the layers n relative to the pixels may be adjusted by adjusting the placement of the bumps 508 relative to the pixels 512. For example, the topography variation of the layers n may repeat at points which cause the topography variation to be different between groups of pixels 512 by adjusting the placement of the bumps 508 into a pattern that repeats over groups of pixels 512.

Figure 8:
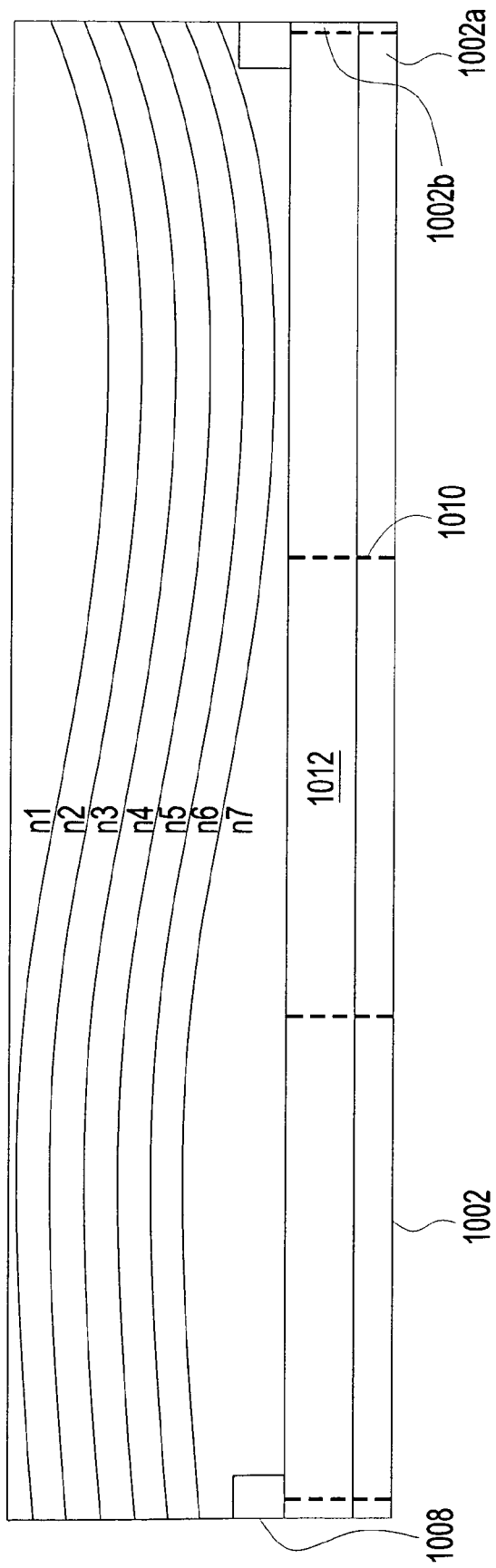
FIG. 8 is a side view of a step of manufacturing lenses according to an embodiment described herein.
Figure 10:
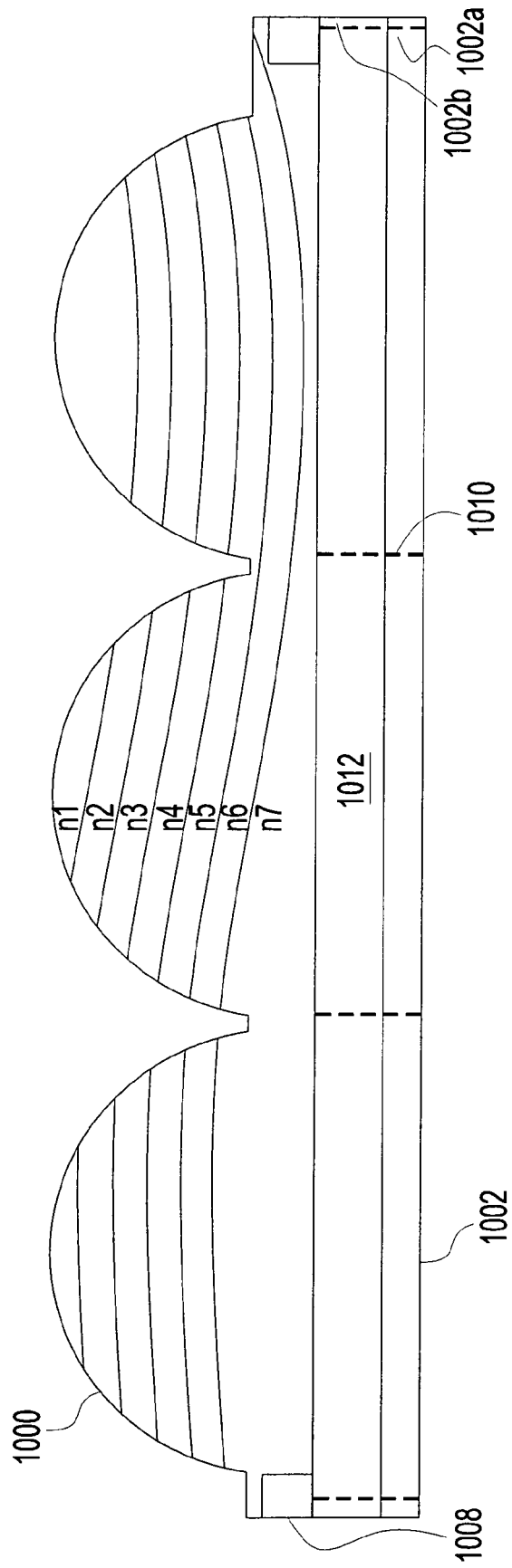
FIG. 10 is a side view of a step of manufacturing lenses according to an embodiment described herein.

FIG. 8 shows a method for making microlenses 1000 (FIG. 10) having an asymmetric index of refraction profile that is different between microlenses 1000 within a group of pixels 1012, and which repeats over groups of pixels 1012. A pixel array including a plurality of pixels 1012, denoted by dashed lines 1010, may be formed in a semiconductor layer 1002a of substrate 1002, which also has a plurality of fabrication layers, including an upper color filter array layer, collectively denoted as 1002b and provided over the semiconductor layer 1002a.

In FIG. 8, the material bumps 1008 are arranged on the surface of the substrate 1002 in a pattern such that one bump 1008 is placed between groups of three pixels 1012. In other embodiments, the groups may have as few as two pixels 1012 or more than three pixels 1012 in each group. A plurality of layers n1, n2, n3, n4, n10, n6, n7 are formed over the substrate 1002 and the bumps 1008 by a method described above with regard to FIG. 2. As can be seen from FIG. 8, the bumps 1008 will cause each layer n to adopt a periodic topography variation defined by the layer n below. The top layer n1 may be planarized. In one embodiment, the top layer n1 may be a photo resist that is completely etched away. In another embodiment, the top layer n1 may be a transparent microlens material, a portion of which remains in the microlenses 1000.

Figure 9:
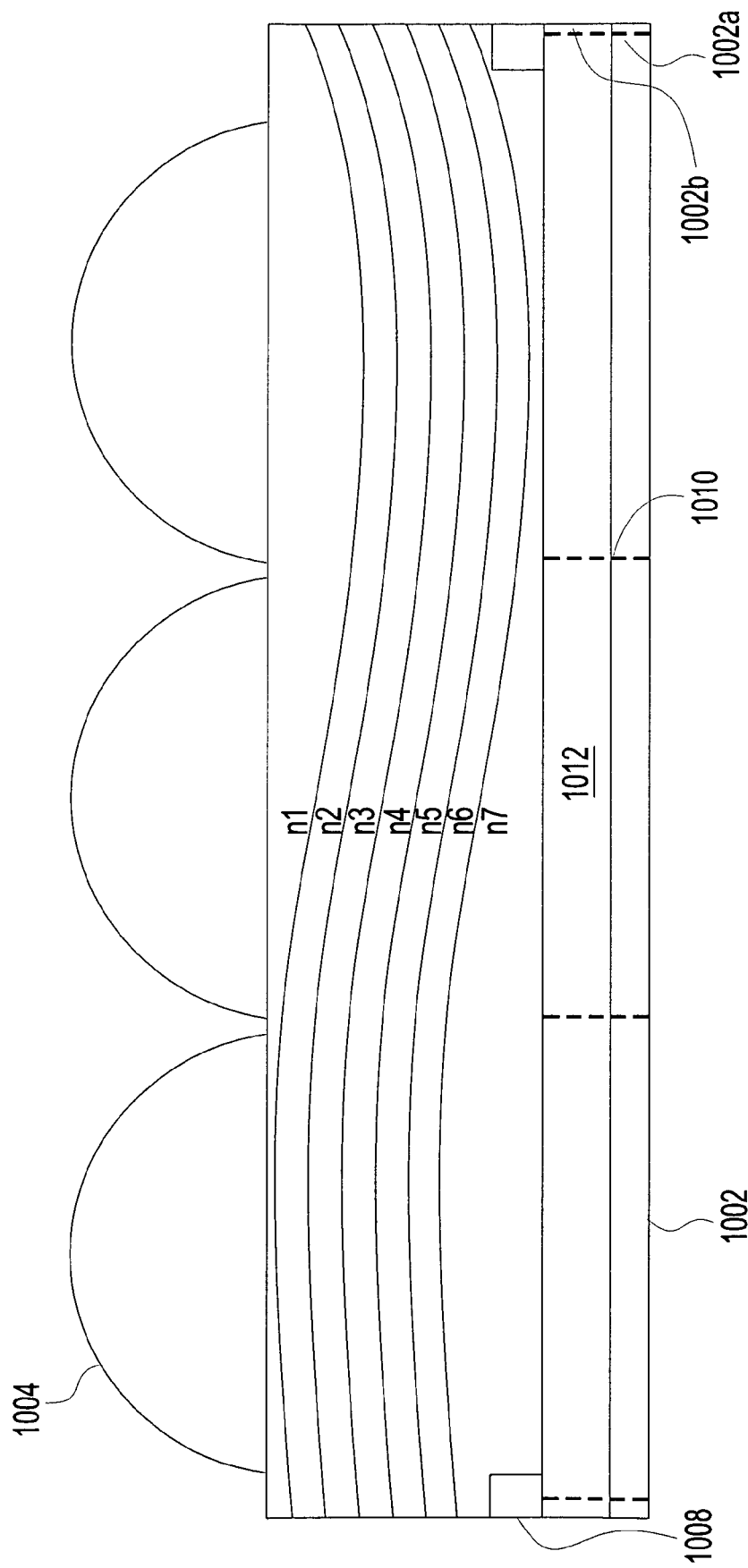
FIG. 9 is a side view of a step of manufacturing lenses according to an embodiment described herein.

As shown in FIG. 9, resist areas 1004 are formed on the top layer n1 by a method described above with regard to FIG. 3. The shape of the resist areas 1004 is transferred into the layers n using anisotropic etching as described above with regard to FIG. 4 to form the microlenses 1000 shown in FIG. 10. The microlenses 1000 having asymmetric index of refraction profiles may be used to reduce cross-talk from angled light.

Figure 11:
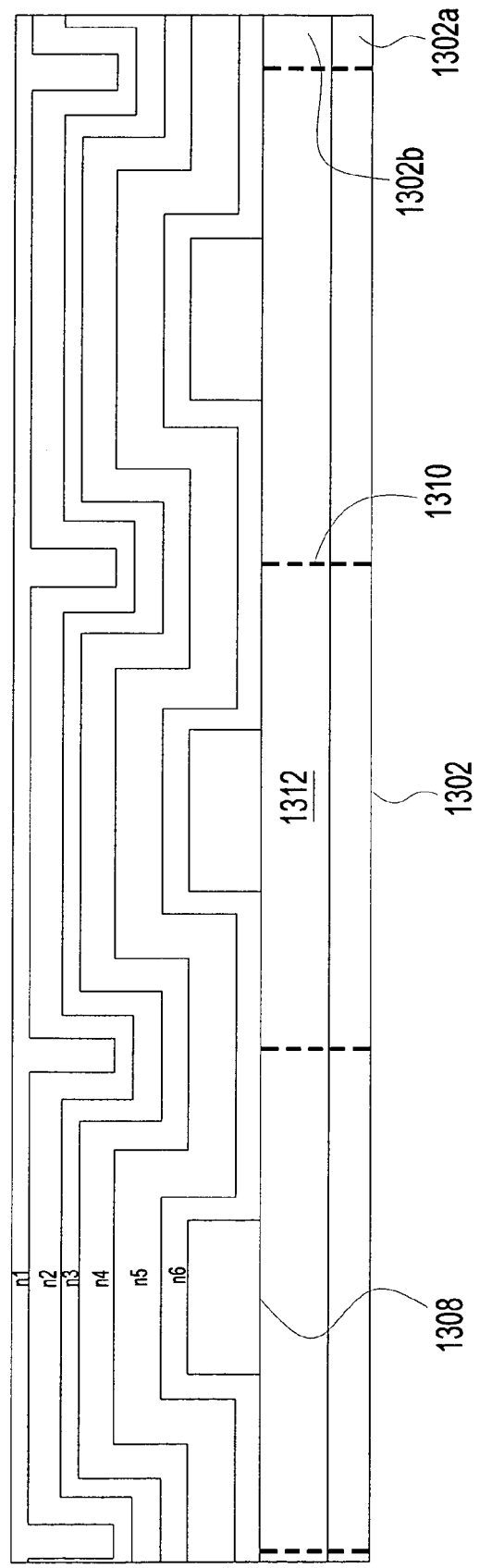
FIG. 11 is a side view of a step of manufacturing lenses according to an embodiment described herein.
Figure 13:
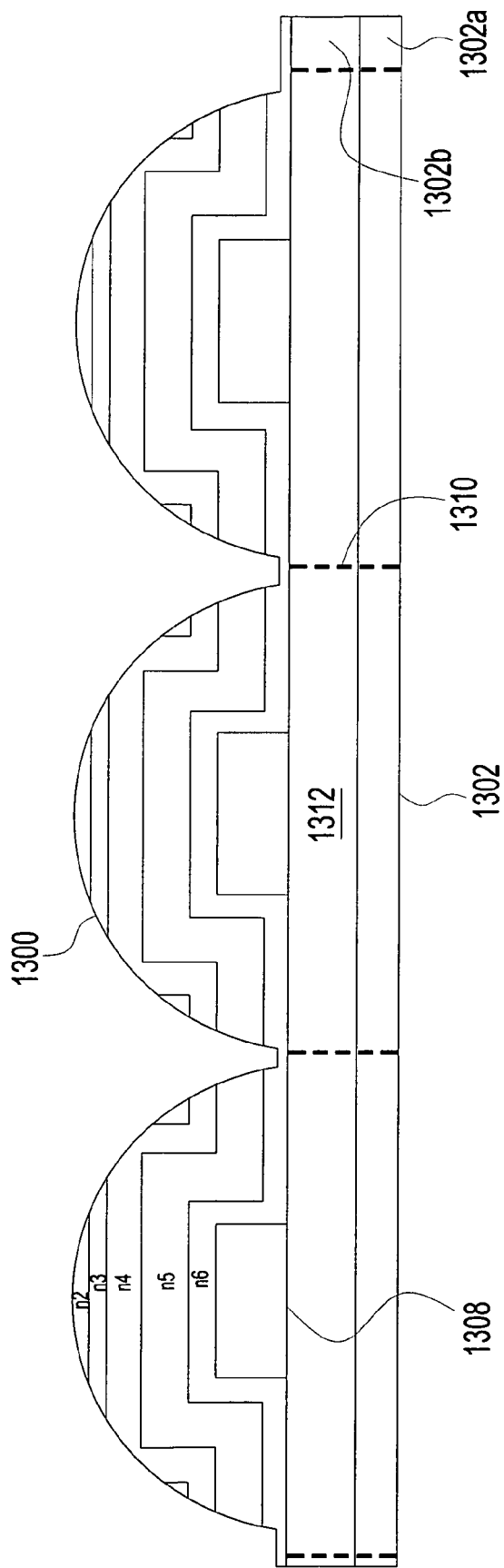
FIG. 13 is a side view of a step of manufacturing lenses according to an embodiment described herein.

FIG. 11 shows another method for making microlenses 1300 (FIG. 13) having a symmetric index of refraction profile in which the layers n substantially conform to the shape of a bump 1308. A pixel array including a plurality of pixels 1312, denoted by dashed lines 1310, may be formed in a semiconductor layer 1302a of substrate 1302, which also has a plurality of fabrication layers, including an upper color filter array layer, collectively denoted as 1302b and provided over the semiconductor layer 1302a.

In FIG. 11, material bumps 1308 are arranged on the surface of the substrate 1302 in a pattern such that one bump 1308 is placed directly over each pixel 1312. The bumps 1308 are formed of a transparent microlens material to allow light to reach the pixel 1312.

A plurality of layers n1, n2, n3, n4, n13, n6 are formed over the substrate 1302 and the bumps 1308 by a method described above with regard to FIG. 2. As can be seen from FIG. 11, the bumps 1308 will cause each layer n to adopt a periodic topography variation defined by the layer n below. In the embodiment of FIG. 11, each layer n is deposited so that it very closely matches the topography of the layer n below it. The top layer n1 may optionally be planarized.

Figure 12:
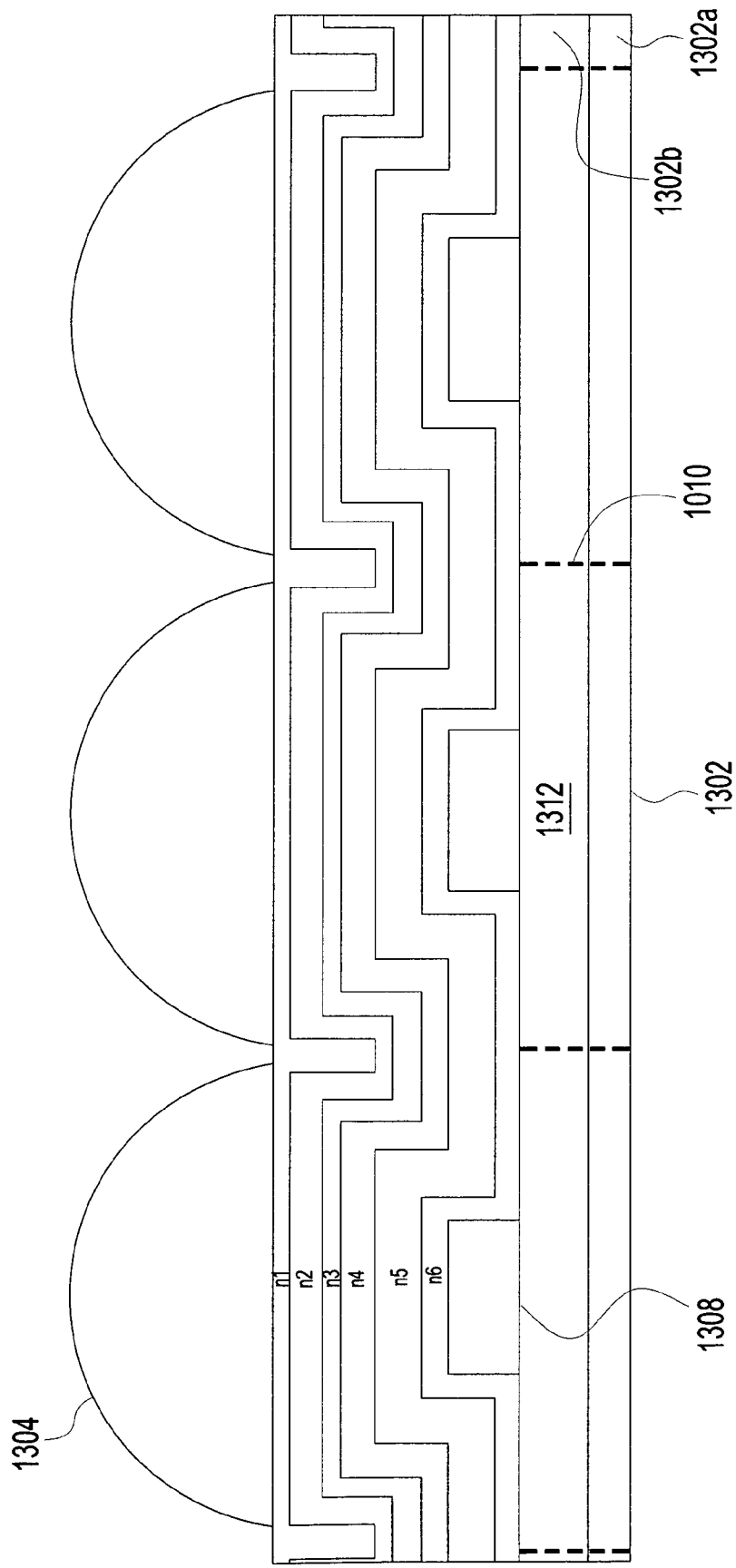
FIG. 12 is a side view of a step of manufacturing lenses according to an embodiment described herein.

As shown in FIG. 12, resist areas 1304 are formed on the top layer n1 by a method described above with regard to FIG. 3. The shape of the resist areas 1304 is transferred into the layers n using anisotropic etching as described above with regard to FIG. 4 to form the microlenses 1300 shown in FIG. 13. It can be seen that layer n1 has been completely etched away so that it is no longer present in the microlenses 1300. In the embodiment shown in FIG. 13, the microlenses 1300 are centered on the bumps 1308, but in other embodiments the microlenses 1300 may be arranged off center from the bumps 1308.

Figure 14:
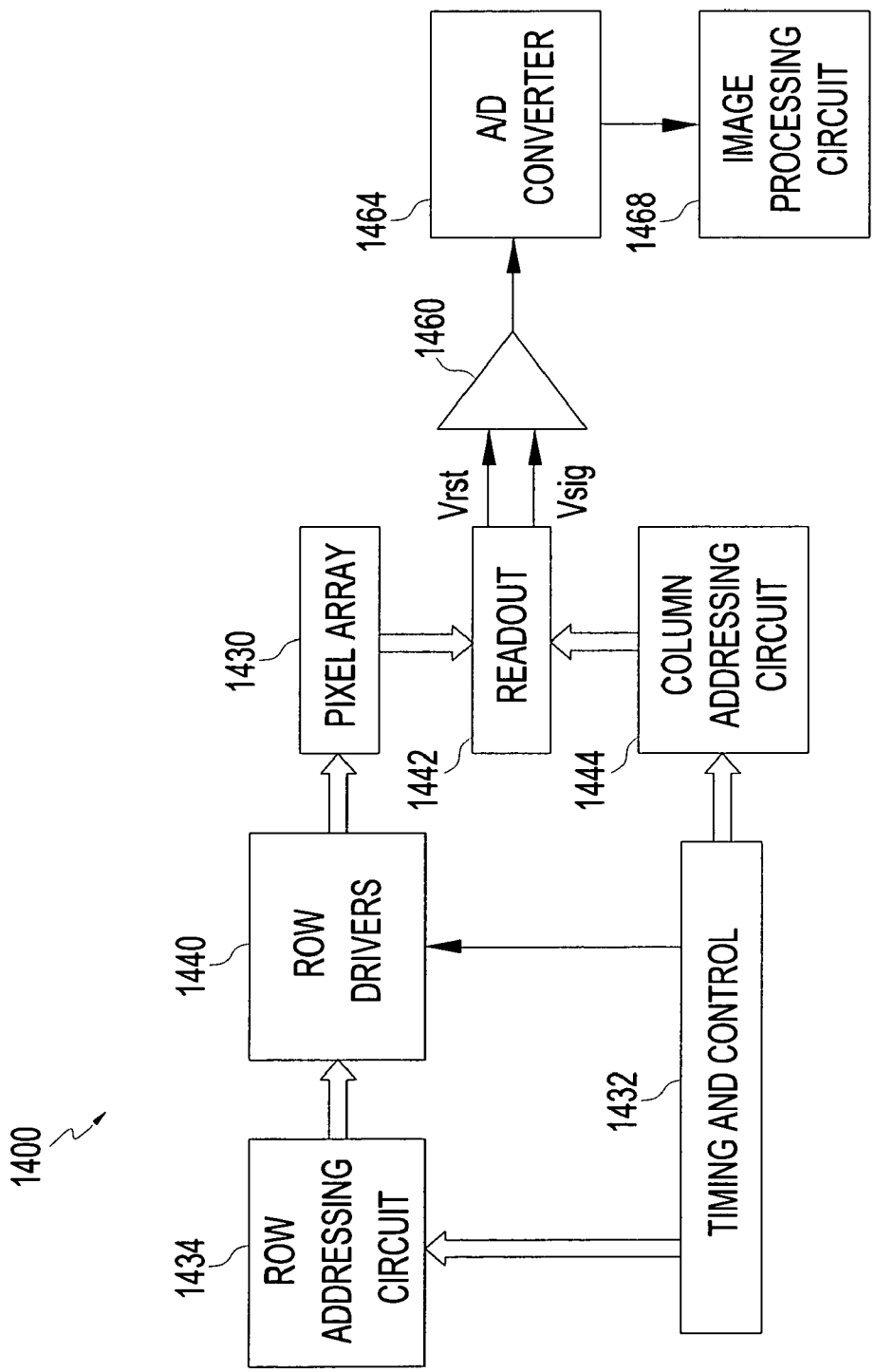
FIG. 14 is a block diagram of an imaging device according to an embodiment described herein.

FIG. 14 shows a block diagram of an imaging device 1400, e.g. a CMOS imaging device which may include microlenses, according to embodiments described herein, arranged over the pixel array 1430. A timing and control circuit 1432 provides timing and control signals for enabling the reading out of signals from pixels of the pixel array 1430 in a manner commonly known to those skilled in the art. The pixel array 1430 has dimensions of M rows by N columns of pixels, with the size of the pixel array 1430 depending on a particular application.

Signals from the imaging device 1400 are typically read out a row at a time using a column parallel readout architecture. The timing and control circuit 1432 selects a particular row of pixels in the pixel array 1430 by controlling the operation of a row addressing circuit 1434 and row drivers 1440. Signals stored in the selected row of pixels are provided to a readout circuit 1442. The signals read from each of the columns of the array sequentially or in parallel using a column addressing circuit 1444. The pixel signals corresponding to the pixel reset signal Vrst and image pixel signal Vsig are provided as outputs of the readout circuit 1442, and are typically subtracted in a differential amplifier 1460 and the result digitized by an analog to digital converter 1464 to provide a digital pixel signal. The digital pixel signals represent an image captured by pixel array 1430 and are processed in an image processing circuit 1468 to provide an output image.

Figure 15:
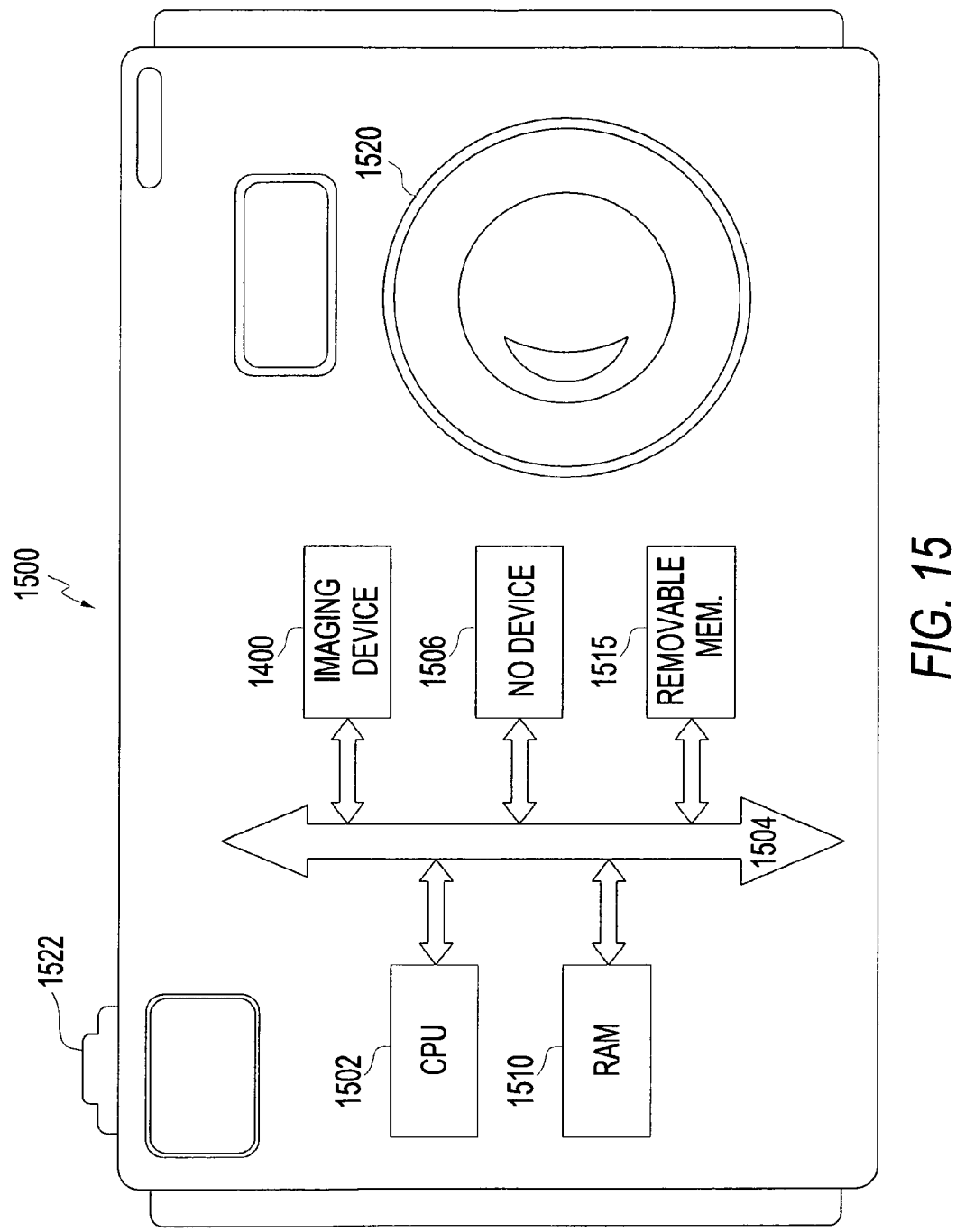
FIG. 15 is a block diagram of a processor system according to an embodiment described herein.

FIG. 15 shows a processor system 1500 that includes an imaging device 1400 having a pixel array, including microlenses constructed and operated in accordance the various embodiment described above. The processor system 1500 is a system having digital circuits that include imaging device 1400. Without being limiting, such a system could include a computer system, camera system, scanner, machine vision, vehicle navigation, video phone, surveillance system, auto focus system, star tracker system, motion detection system, image stabilization system, or other image acquisition system.

Processor system 1500, for example a digital still or video camera system, generally comprises a central processing unit (CPU) 1502, such as a control circuit or microprocessor for conducting camera functions, that communicates with one or more input/output (I/O) devices 1506 over a bus 1504. Imaging device 1400 also communicates with the CPU 1502 over the bus 1504. The processor system 1500 also includes random access memory (RAM) 1510, and can include removable memory 1515, such as flash memory, which also communicates with the CPU 1502 over the bus 1504. The imaging device 1400 may be combined with the CPU processor with or without memory storage on a single integrated circuit or on a different chip than the CPU processor. In a camera system, a camera lens 1520 according to various embodiments described herein may be used to focus image light onto the pixel array 1430 and associated microlenses of the imaging device 1400 and an image is captured when a shutter release button 1522 is pressed.

While various embodiments of the present invention have been described above, it should be understood that they have been presented by way of example, and not limitation. It will be apparent to persons skilled in the relevant art(s) that various changes in form and detail can be made therein without departing from the spirit and scope of the present invention. Thus, the present invention should not be limited by any of the above-described exemplary embodiments.

What is claimed as new and desired to be protected by Letters Patent of the United States is:

1. A microlens comprising:
   a plurality of stacked materials, each material having an index of refraction different from an adjacent material; and
   the stacked materials being formed as a lens shape,
   wherein said microlens comprises an asymmetric gradient index of refraction profile at a distance from a central vertical axis of the microlens.

2. The microlens of claim 1, wherein each material comprises an index of refraction greater than the index of refraction of the material below it.

3. The microlens of claim 1, wherein said lens shape is curved.

4. The microlens of claim 1, wherein the plurality of stacked materials comprises a first material stacked upon a second material and wherein the first material is different from the second material.

5. The microlens of claim 1, wherein the plurality of stacked materials comprises a first material stacked upon a second material and wherein the first material comprises a mixture of materials at a first ratio, and wherein the second material comprises a mixture of the same materials at a second ratio that is different from the first ratio.

6. The microlens of claim 1, wherein the plurality of stacked materials comprises a first material stacked upon a second material and wherein the first material and the second material comprise different thicknesses.

7. The microlens of claim 1, further comprising a material bump arranged under the stacked material such that a shape of the stacked material is affected by a shape of the material bump.

8. The microlens of claim 1, wherein the plurality of stacked materials comprise a curved profile.

9. The microlens of claim 1, wherein the plurality of stacked materials comprise a profile having an angle.

10. The micro lens of claim 9, wherein the angle is substantially a right angle.

11. The microlens of claim 1, wherein a profile shape of the plurality of stacked materials of the microlens is different than a profile shape of a plurality of stacked materials of a second microlens arranged in a same pixel array as the microlens.

12. A microlens comprising:
    a plurality of stacked materials, each material having an index of refraction different from an adjacent material;
    the stacked materials being formed as a lens shape; and
    a material bump arranged under the stacked material such that the stacked material is affected by a shape of the material bump.

13. The microlens of claim 12, wherein each material comprises an index of refraction greater than the index of refraction of the material below it.

14. The microlens of claim 12, wherein the material bump is transparent.

15. The microlens of claim 12, wherein the material bump is arranged at an edge of the microlens.

16. The microlens of claim 12, wherein the material bump is arranged at a center of the microlens.

17. The microlens of claim 12, wherein the material bump comprises a strip of material extending beyond the edge of the microlens.

18. The microlens of claim 12, wherein the material bump is arranged to one side of the microlens.

19. The microlens of claim 12, wherein said microlens comprises an asymmetric gradient index of refraction profile at a distance from a central vertical axis of the microlens.

20. The microlens of claim 12, wherein said microlens comprises a symmetrical gradient index of refraction profile at a distance from a central vertical axis of the microlens.

21. A microlens comprising:
    a plurality of stacked materials, each material having an index of refraction different from an adjacent material; and
    the stacked materials being formed as a lens shape,
    wherein said microlens is part of a microlens array arranged over a pixel array of an imaging device, and
    wherein said microlenses are shifted relative to the pixel array.

22. The microlens of claim 21, wherein the lens shape is parabolic.

23. The microlens of claim 21, wherein the amount that the microlenses are shifted relative to the pixel array is dependent on the refractive index profile of the plurality of stacked materials.

24. The microlens of claim 21, further comprising a material bump arranged under the stacked material such that a shape of the stacked material is affected by a shape of the material bump.

25. The microlens of claim 21, wherein said microlens comprises an asymmetric gradient index of refraction profile at a distance from a central vertical axis of the microlens.

* * * * *